(12) United States Patent
Lee

(10) Patent No.: US 10,062,439 B2
(45) Date of Patent: Aug. 28, 2018

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/606,674

(22) Filed: May 26, 2017

(65) Prior Publication Data

US 2018/0075909 A1 Mar. 15, 2018

(30) Foreign Application Priority Data

Sep. 12, 2016 (KR) ........................ 10-2016-0117329

(51) Int. Cl.
*G11C 16/10* (2006.01)
*G11C 16/34* (2006.01)

(52) U.S. Cl.
CPC .......... *G11C 16/10* (2013.01); *G11C 16/3459* (2013.01)

(58) Field of Classification Search
CPC ............................. G11C 16/10; G11C 16/3459
See application file for complete search history.

(56) References Cited

U.S. PATENT DOCUMENTS

| 2009/0323429 A1* | 12/2009 | Lee ...................... G11C 11/5628 365/185.19 |
| 2011/0122692 A1* | 5/2011 | Dutta .................. G11C 11/5628 365/185.03 |
| 2013/0322171 A1* | 12/2013 | Lee ........................ G11C 29/04 365/185.03 |
| 2015/0023097 A1 | 1/2015 | Khoueir et al. |

FOREIGN PATENT DOCUMENTS

| KR | 1020130007932 A | 1/2013 |
| KR | 1020140020010 A | 2/2014 |

* cited by examiner

*Primary Examiner* — Tri Hoang
(74) *Attorney, Agent, or Firm* — William Park & Associates Ltd.

(57) ABSTRACT

A semiconductor memory device in accordance with an embodiment may include a memory cell array, a peripheral circuit, and a control circuit. The memory cell array may include a plurality of memory cells programmed to any one of first to N-th program states divided based on threshold voltages. The peripheral circuit may perform a program operation on the memory cells. The control circuit may control the peripheral circuit so that, during the program operation, a primary program operation is performed, and after the primary program operation, a secondary program operation is performed. The primary program operation may include a plurality of verify steps performed for the first to N−1-th program states and a single primary verify step performed for the N-th program state. The secondary program operation may include a secondary verify step performed for the N-th program state.

14 Claims, 12 Drawing Sheets

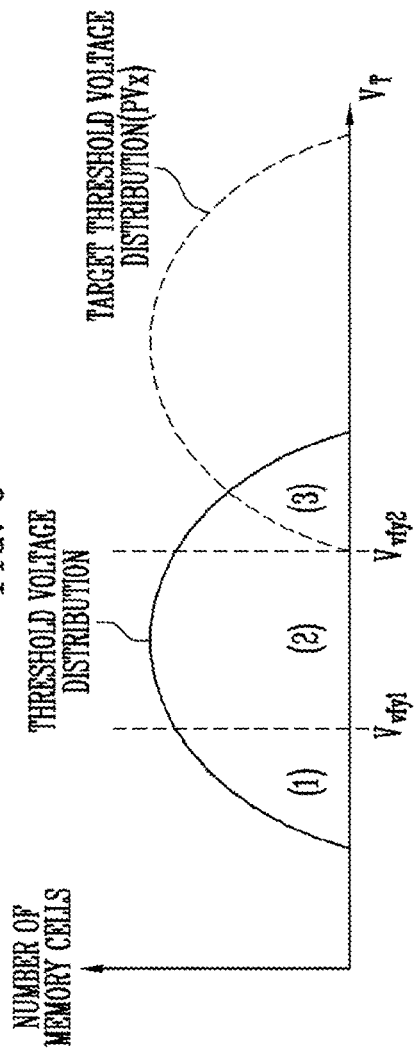
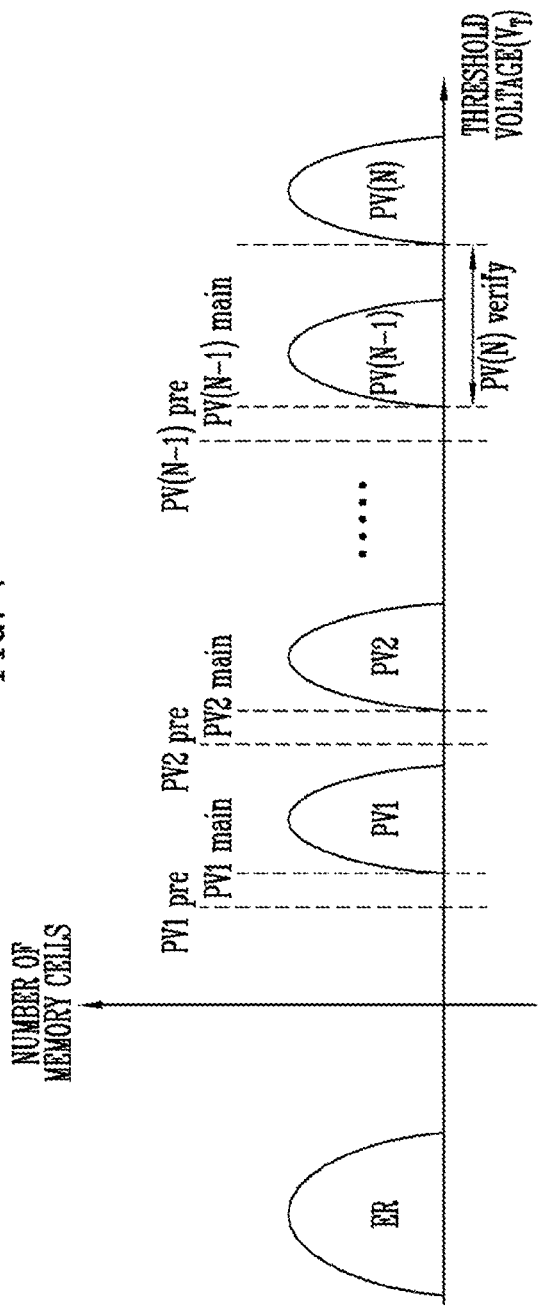

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2016-0117329 filed on Sep. 12, 2016 in the Korean Intellectual Property Office, the entire disclosure of which is incorporated herein by reference.

BACKGROUND

1. Technical Field

Various embodiments of the present disclosure generally relate to an electronic device, and more particularly to a semiconductor memory device and a method of operating the semiconductor memory device.

2. Related Art

Semiconductor memory devices are memory devices realized using semiconductor materials such as silicon (Si), germanium (Ge), gallium arsenide (GaAs), indium phosphide (InP), or the like. Semiconductor memory devices may be classified into volatile memory devices and nonvolatile memory devices.

The volatile memory device is a memory device that only retains its data while it is powered. Representative examples of the volatile memory device include a static RAM (SRAM), a dynamic RAM (DRAM), a synchronous DRAM (SDRAM), etc. The nonvolatile memory device is a memory device that can retain its data even in the absence of a power source. Representative examples of the nonvolatile memory device include a read-only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory may be classified into a NOR type memory and a NAND type memory.

SUMMARY

In an embodiment of the present disclosure, a semiconductor memory device may include a memory cell array, a peripheral circuit, and a control circuit. The memory cell array may include a plurality of memory cells to be programmed to any one of first to N-th program states distinguishable based on threshold voltages of the memory cells. The peripheral circuit may perform a program operation on the plurality of memory cells. The control circuit may control the peripheral circuit so that, during the program operation, a primary program operation is performed, and after the primary program operation, a secondary program operation is performed. The primary program operation may include a plurality of verify steps performed for the first to N−1-th program states and a single primary verify step performed for the N-th program state. The secondary program operation may include a secondary verify step performed for the N-th program state.

In an embodiment of the present disclosure, a semiconductor memory device may include a memory cell array, a peripheral circuit, and a control circuit. The memory cell array may include a plurality of memory cells to be programmed to any one of first to N-th program states distinguishable based on threshold voltages of the memory cells. The peripheral circuit may perform a program operation on the plurality of memory cells. The control circuit may control the peripheral circuit so that the program operation is performed by performing at least two verify steps corresponding to each of the first to N-th program states until the memory cells to be programmed to the first to N−1-th program states have passed program verifications during the program operation.

In an embodiment of the present disclosure, a method of operating a semiconductor memory device including a plurality of memory cells to be programmed to any one of first to N-th program states distinguishable based on threshold voltages of the memory cells may include performing a primary program operation including a plurality of verify steps performed for the first to N−1-th program states and a single primary verify step performed for the N-th program state. The method of operating the semiconductor memory device may also include, after the primary program operation, performing a secondary program operation including a secondary verify step performed for the N-th program state.

In an embodiment of the present disclosure, a method of operating a semiconductor memory device including a plurality of memory cells to be programmed to any one of first to N-th program states distinguishable based on threshold voltages of the memory cells may include performing a program operation by performing at least two verify steps corresponding to each of the first to N-th program states until the memory cells to be programmed to the first to N−1-th program states have passed program verifications. The method of operating the semiconductor memory device may also include, if the memory cells to be programmed to the first to N−1-th program states have passed the program verifications, performing a reprogram operation for the N-th program state.

BRIEF DESCRIPTION OF THE DRAWINGS

FIG. 6 is a diagram illustrating an example of a program method that is performed based on a double verify operation.

FIG. 7 is a diagram illustrating an example of a verification voltage used in a method of operating a semiconductor memory device according to an embodiment of the present disclosure.

DETAILED DESCRIPTION

Figure 1:
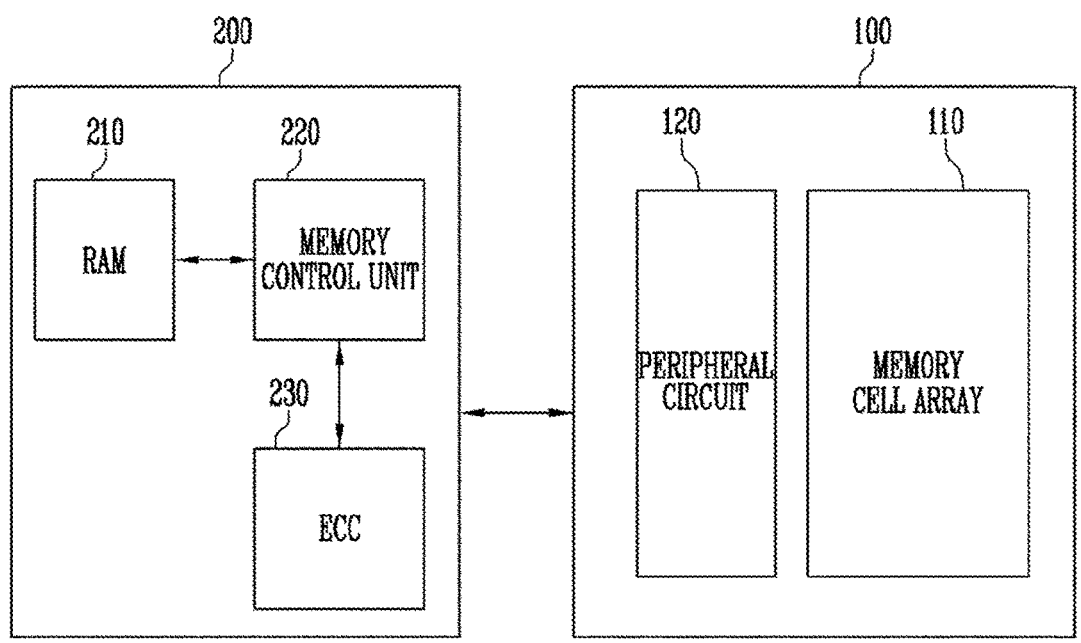
FIG. 1 is a diagram illustrating an example configuration of a memory system.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, embodiments will be described in greater detail with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

Hereinafter, the present disclosure will be described in detail by describing exemplary embodiments of the present disclosure with reference to the attached drawings. Below, embodiments of the present disclosure will be described in detail with reference to the attached drawings.

FIG. 1 is a diagram illustrating an example configuration of a memory system.

A memory system includes a semiconductor memory device 100 and a controller 200.

Examples of the semiconductor memory device 100 may include a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), and a spin transfer torque random access memory (STT-RAM). In addition, the semiconductor memory device 100 according to an embodiment of the present disclosure may be implemented as a three-dimensional array structure. The present disclosure may also be applied not only to a flash memory that has a conductive floating gate (FG) as a charge storage layer, but also to a charge trap flash (CTF) memory which has a charge trap layer as a charge storage layer. Here, the charge trap layer may be made from electrical insulating material.

The semiconductor memory device 100 includes a memory cell array 110 and a peripheral circuit 120. The memory cell array 110 includes a plurality of nonvolatile memory cells. The peripheral circuit 120 may be used to drive the memory cell array 110.

Memory cells of the memory cell array 110 may be grouped into a plurality of memory blocks. The memory blocks may be divided into system blocks and user blocks according to their intended use.

In an embodiment, the memory cell array 110 may include a content addressable memory (CAM) area. The CAM area may include a plurality of memory cells that are included in at least one memory block. In the CAM area, various types of setup information required for the operation of the semiconductor memory device 100 may be stored. For example, in the CAM area, conditions or other pieces of information relating to a data input/output operation may be stored. In an embodiment, in the CAM area, information about the number of read/write operations (Program/Erase [P/E] cycle), addresses of erroneous columns, and addresses of erroneous blocks may be stored. In an embodiment, in the CAM area, option information, which is required for the operation of the semiconductor memory device 100, such as program voltage information, read voltage information, erase voltage information, the thickness information of the gate oxide film of each cell, etc., may be stored. In an embodiment, in the CAM area, information about voltages applied to bit lines during a program operation may be stored.

When power is supplied to the semiconductor memory device 100, information stored in the CAM area is read by the peripheral circuit 120, and the peripheral circuit 120 may control the memory cell array 110 so that the data input/output operation on the memory cells is performed under the set conditions, based on the read information.

The peripheral circuit 120 is operated under the control of the controller 200. The peripheral circuit 120 may write data into the memory cell array 110 under the control of the controller 200. The peripheral circuit 120 may read out data from the memory cell array 110 and erase data from the memory cell array 110.

In various embodiments, the read operation and the program operation of the semiconductor memory device 100 may be performed on a page basis. The erase operation of the semiconductor memory device 100 may be performed on a memory block basis.

During a program operation, the peripheral circuit 120 may receive, from the controller 200, a command indicating a program operation, a physical block address PBA, and program data. The peripheral circuit 120 may select a certain memory block and a certain page, and may write program data into the selected page in response to the physical block address PBA.

During a read operation, the peripheral circuit 120 may receive a command indicating a read operation (hereinafter referred to as a "read command") and a physical block address PBA from the controller 200. The peripheral circuit 120 may read data from a memory block selected in response to the physical block address PBA and from a page included in the memory block, and may output the data (hereinafter referred to as "page data") to the controller 200.

During an erase operation, the peripheral circuit 120 may receive, from the controller 200, a command indicating an erase operation and a physical block address PBA. The physical block address PBA may be used to select a memory block that is intended to access. The peripheral circuit 120 may erase data stored in the memory block corresponding to the physical block address PBA.

The controller 200 controls the overall operation of the semiconductor memory device 100. The controller 200 may access the semiconductor memory device 100 in response to a request from an external device such as a host hardware or software. The controller 200 may provide a command to the semiconductor memory device 100 in response to the request from the external device.

In an embodiment, the controller 200 may control the semiconductor memory device 100 so that operations such as a program operation, a read operation, and an erase operation are performed. In the program operation, the controller 200 may provide the program command, the address, and the data to the semiconductor memory device 100 through a channel. In the read operation, the controller 200 may provide the read command and the address to the semiconductor memory device 100 through a channel. In the erase operation, the controller 200 may provide the erase command and the address to the semiconductor memory device 100 through a channel.

The controller 200 may include a random access memory (RAM) 210, a memory control unit 220, and an error correction code (ECC) circuit 230.

The RAM 210 is operated under the control of the memory control unit 220, and may be used as a work memory, a buffer memory, a cache memory, or the like. When the RAM 210 is used as the work memory, data processed by the memory control unit 220 may be temporarily stored in the RAM 210. When the RAM 210 is used as the buffer memory, the RAM may be used to buffer data that is to be transmitted from an external device such as a host hardware or software (not illustrated) to the semiconductor memory device 100 or from the semiconductor memory device 100 to the external device.

The memory control unit 220 may control a read operation, a program operation, an erase operation, and a background operation of the semiconductor memory device 100.

The memory control unit 220 may run firmware for controlling the semiconductor memory device 100.

The memory control unit 220 may perform a function of a Flash Translation Layer (FTL). The memory control unit 220 may translate a logical block address (LBA), provided by the external device such as a host hardware or software, into a physical block address (PBA) through the FTL. The FTL may receive the LBA using a mapping table, and may translate the LBA into the PBA. Address mapping methods performed through the FTL include various methods according to a mapping unit. Representative examples of address mapping methods may include a page mapping method, a block mapping method, and a hybrid mapping method.

The ECC circuit 230 may generate an error correction code (ECC) to detect data bits in error and correct the erroneous data bits. The program data may be generated such that it contains the ECC. During a read operation, the ECC circuit 230 may correct the erroneous data bits contained in page data using the ECC. The ECC circuit 230 may correct errors using a low density parity check (LDPC) code, a Bose, Chaudhri, Hocquenghem (BCH) Code, a turbo code, a Reed-Solomon code, a convolution code, a recursive systematic code (RSC), or coded modulation such as trellis-coded modulation (TCM), block coded modulation (BCM), or Hamming code.

During a read operation, the ECC circuit 230 may correct errors contained in the read page data. When a number of erroneous bits in the page data exceeds a number of correctable bits, decoding may fail. When the number of error bits in the page data falls within the number of correctable bits, decoding may succeed.

A success in decoding indicates that the corresponding read command has passed. A failure in decoding indicates that the corresponding read command has failed. When decoding succeeds, the controller 200 outputs error-corrected page data to the external device.

Although not illustrated, the controller 200 may further include a memory interface for communicating with the semiconductor memory device 100. The memory interface includes a protocol for communicating with the semiconductor memory device 100. For example, the memory interface may include at least one of flash interfaces such as a NAND interface and a NOR interface.

The controller 200 may further include a host interface (not illustrated) to perform data exchange between a host and the controller 200. The host interface includes protocols required for communication between the host and the controller 200. In an embodiment, the controller 200 may communicate with an external hardware or software (e.g., host) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

Figure 2:
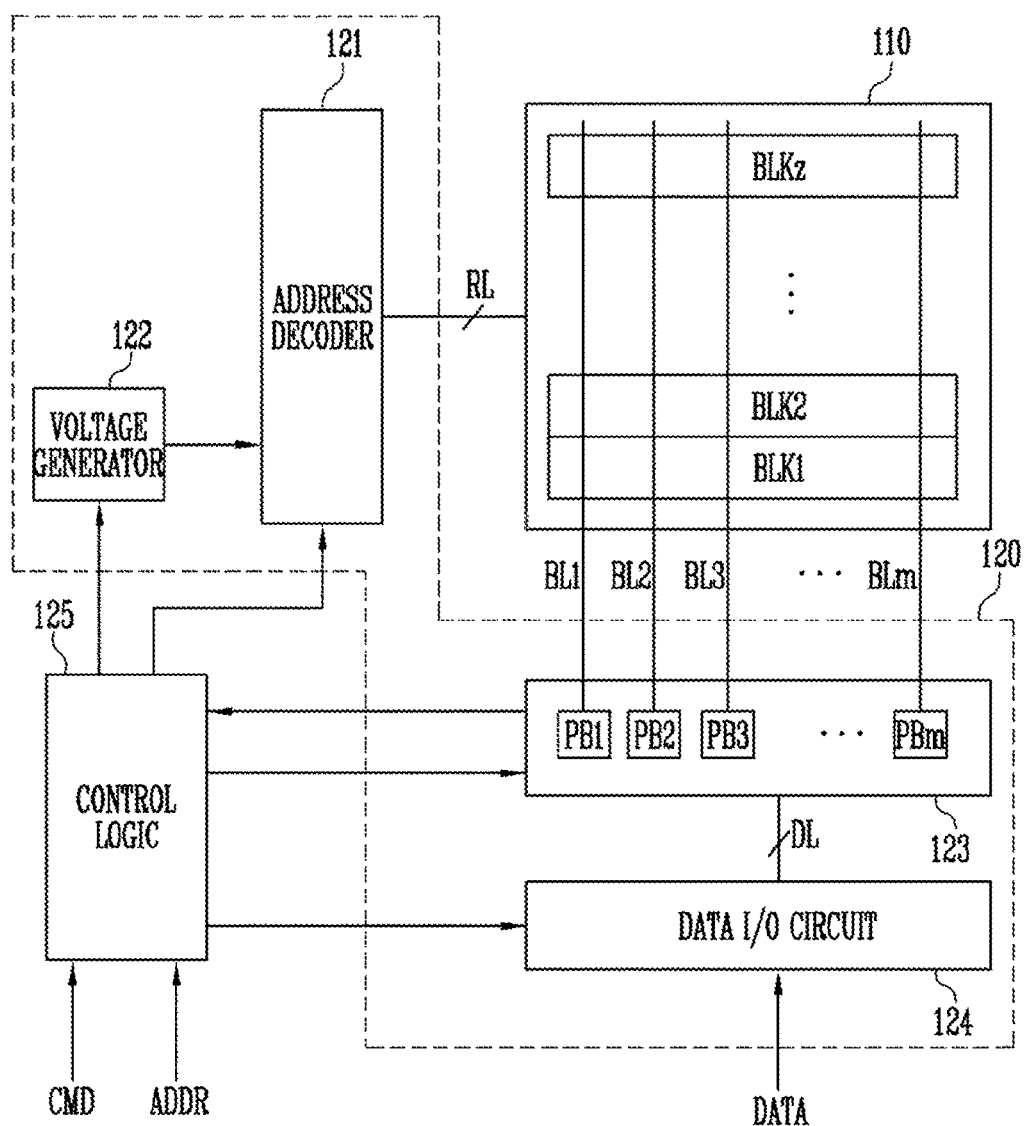
FIG. 2 is a diagram illustrating an example of a semiconductor memory device according to an embodiment of the present disclosure.

FIG. 2 is a diagram illustrating an example of a semiconductor memory device according to an embodiment of the present disclosure.

Figure 3:
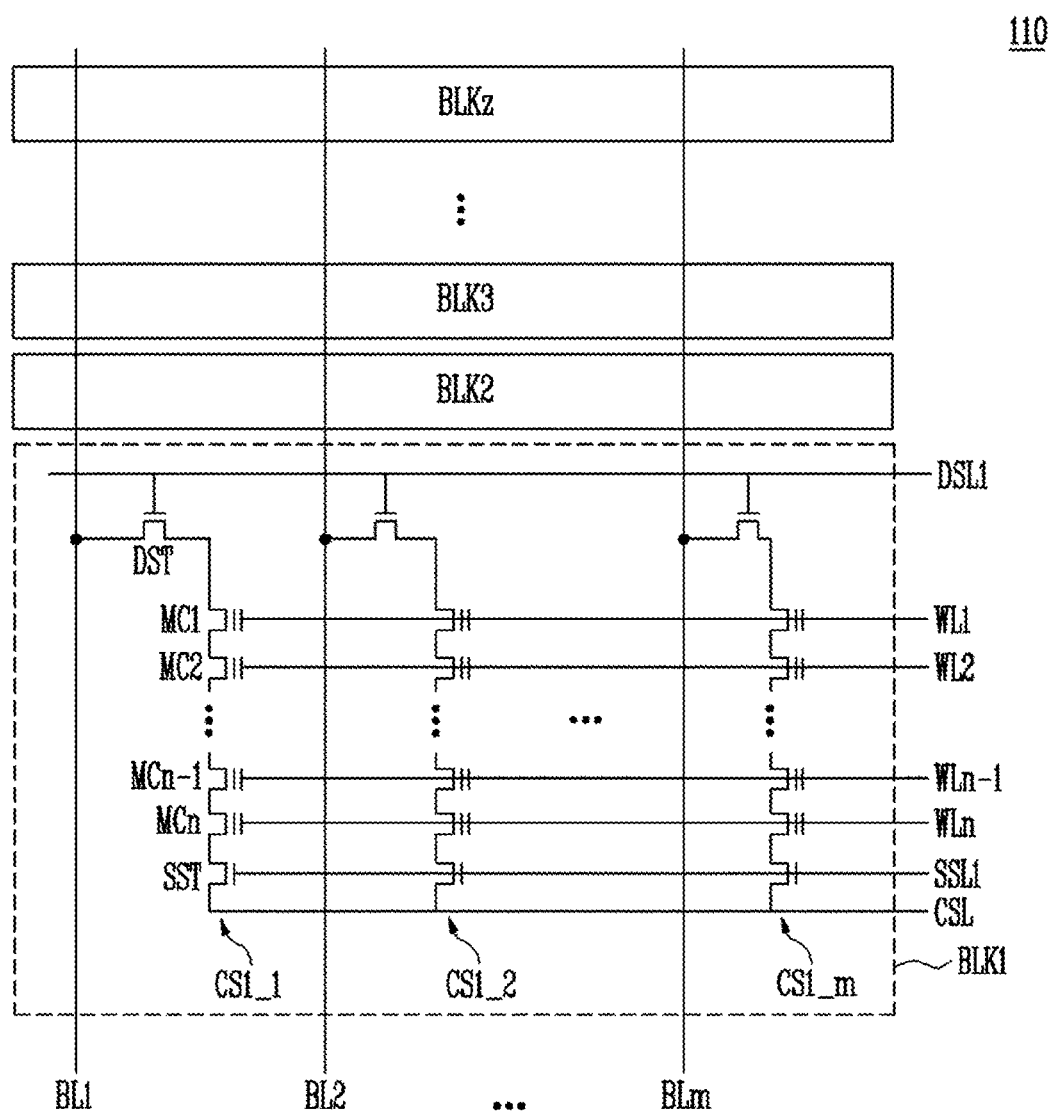
FIG. 3 is a diagram illustrating an example structure of a memory cell array of FIG. 2.

FIG. 3 is a diagram illustrating an example structure of the memory cell array 110 of FIG. 2.

Referring to FIG. 2, the semiconductor memory device 100 includes the memory cell array 110, a peripheral circuit 120, and control logic 125.

The memory cell array 110 includes a plurality of memory blocks BLK1 to BLKz. The plurality of memory blocks BLK1 to BLKz are coupled to an address decoder 121 through row lines RL and are coupled to a read and write circuit 123 through bit lines BL1 to BLm. Each of the memory blocks BLK1 to BLKz includes a plurality of memory cells. In an embodiment, the memory cells are nonvolatile memory cells.

The plurality of memory cells included in the memory cell array 110 may be divided into a plurality of blocks according to the intended use thereof.

Referring to FIG. 3, the first to z-th memory blocks BLK1 to BLKz are coupled in common to the first to m-th bit lines BL1 to BLm. In FIG. 3, for the convenience of description, elements included in the first memory block BLK1, among the plurality of memory blocks BLK1 to BLKz, are illustrated, and the illustration of elements respectively included in the remaining memory blocks BLK2 to BLKz is omitted. It will be understood that each of the remaining memory blocks BLK2 to BLKz is configured in the same way as the first memory block BLK1.

The memory block BLK1 includes a plurality of cell strings CS1_1 to CS1_m. The first to m-th cell strings CS1_1 to CS1_m are coupled to the first to m-th bit lines BL1 to BLm, respectively.

Each of the first to m-th cell strings CS1_1 to CS1_m includes a drain select transistor DST, a plurality of series-connected memory cells MC1 to MCn, and a source select transistor SST. The drain select transistor DST is coupled to a drain select line DSL1. The first to n-th memory cells MC1 to MCn are coupled to first to n-th word lines WL1 to WLn, respectively. The source select transistor SST is coupled to a source select line SSL1. A drain of the drain select transistor DST is coupled to the corresponding bit line. The drain select transistors of the first to m-th cell strings CS1_1 to CS1_m are coupled to the first to m-th bit lines BL1 to BLm, respectively. A source of the source select transistor SST is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 121. The common source line CSL is controlled by control logic 125. The first to m-th bit lines BL1 to BLm are controlled by a read and write circuit 123.

Referring back to FIG. 2, the peripheral circuit 120 includes the address decoder 121, a voltage generator 122, the read and write circuit 123, and a data input/output (I/O) circuit 124. The address decoder 121 is coupled to the memory cell array 110 through row lines RL. The address decoder 121 may operate under the control of the control logic 125. The address decoder 121 receives an address ADDR through the control logic 125.

In an embodiment, a program operation and a read operation of the semiconductor memory device 100 are performed on a page basis. During the program operation and the read operation, the address ADDR may include a block address and a row address. The address decoder 121 may decode a block address included in the received address ADDR. The address decoder 121 selects one of the memory blocks BLK1 to BLKz in response to the decoded block address. The address decoder 121 may decode a row address in the received address ADDR. The address decoder 121 selects a word line from the selected memory block by applying voltages, provided by the voltage generator 122, to row lines RL in response to the decoded row address.

During a program operation, the address decoder 121 may apply a program voltage to the selected word line and apply a pass voltage having a level lower than that of the program voltage to unselected word lines. During a program verify operation, the address decoder 121 may apply a verification voltage to the selected word line and apply a verification pass voltage higher than the verification voltage to the unselected word lines. In an embodiment, the program verify operation may be performed using a plurality of verification voltages. For example, verification may be performed using a first verification voltage and a second verification voltage. This method of program verification is referred to as a "double verify" method. The double verify method will be described later in detail with reference to FIG. 6.

During a read operation, the address decoder 121 may apply a read voltage to the selected word line and apply a pass voltage higher than the read voltage to the unselected word lines.

In an embodiment, an erase operation of the semiconductor memory device 100 is performed on a memory block basis. During the erase operation, the address ADDR includes a block address. The address decoder 121 decodes the address ADDR to obtain the block address and selects a memory block in response to the decoded block address.

In an embodiment, the address decoder 121 may include a block decoder, a word line decoder, an address buffer, etc.

The voltage generator 122 may generate a plurality of voltages using an external supply voltage that is provided to the semiconductor memory device 100. The voltage generator 122 is operated under the control of the control logic 125.

In an embodiment, the voltage generator 122 may generate an internal supply voltage by regulating the external supply voltage. The internal supply voltage generated by the voltage generator 122 is used as an operating voltage for the semiconductor memory device 100.

In an embodiment, the voltage generator 122 may generate a plurality of voltages using the external supply voltage or the internal supply voltage. For example, the voltage generator 122 may include a plurality of pumping capacitors for receiving the internal supply voltage, and may generate a plurality of voltages by selectively activating the plurality of pumping capacitors under the control of the control logic 125. The generated voltages are applied to the word lines selected by the address decoder 121.

The read and write circuit 123 includes first to m-th page buffers PB1 to PBm. The first to m-th page buffers PB1 to PBm are coupled to the memory cell array 110 through the first to m-th bit lines BL1 to BLm. The first to m-th page buffers PB1 to PBm are operated under the control of the control logic 125.

The first to m-th page buffers PB1 to PBm transmit/receive data to/from the data I/O circuit 124. During a program operation, the first to m-th page buffers PB1 to PBm may receive data DATA to be stored through the data I/O circuit 124 and data lines DL.

During a program operation, when a program pulse is applied to the selected word line, the first to m-th page buffers PB1 to PBm may transfer the data DATA to be stored (e.g., the data DATA received through the data I/O circuit 124) to the selected memory cells through the bit lines BL1 to BLm. Whether to program the memory cells of the selected page and to what voltage level they are programmed will be determined depending on the data DATA.

A threshold voltage of a memory cell coupled to a bit line receiving a program permission voltage (e.g. a ground voltage) may increase in response to the program voltage applied to the selected word line. A threshold voltage of a memory cell coupled to a bit line receiving a program prohibition voltage (e.g. a supply voltage) may be maintained. During a program verify operation, the first to m-th page buffers PB1 to PBm may read page data from the selected memory cells through the bit lines BL1 to BLm.

Each of the memory cells of the semiconductor memory device 100 may be implemented as a single-level cell (SLC) capable of storing a single data bit, a multi-level cell (MLC) capable of storing two data bits, a triple-level cell (TLC) capable of storing three data bits, or a quad-level cell (QLC) capable of storing four data bits.

When the memory cell is a single-level cell (SLC) for storing a single data bit, the memory cell may have one of an erase state and a first program state (i.e., a first threshold voltage distribution) PV1 after a program operation is performed. When the memory cell is a multi-level cell (MLC) for storing two data bits, the memory cell may have an erase state or one of first to third program states (i.e., first to third threshold voltage distributions) PV1 to PV3 after a program operation is performed. When the memory cell is a triple-level cell (TLC) for storing three data bits, the memory cell may have an erase state or one of first to seventh program states (i.e., first to seventh threshold voltage distributions) PV1 to PV7 after a program operation is performed. When the memory cell is a quad-level cell (QLC) for storing four data bits, the memory cell may have an erase state or one of first to fifteenth program states (i.e., first to fifteenth threshold voltage distributions) PV1 to PV15 after a program operation is performed. In an embodiment, the memory cell may store five or more data bits, and thus the number of program states that the memory cell may have may increase.

During a read operation, the read and write circuit 123 reads data DATA from memory cells in the selected page through bit lines BL, and outputs the read data DATA to the data I/O circuit 124.

During an erase operation, the read and write circuit 123 may allow the bit lines BL to float.

The data I/O circuit 124 is coupled to the first to m-th page buffers PB1 to PBm through data lines DL. The data I/O circuit 124 is operated under the control of the control logic 125. During a program operation, the data I/O circuit 124 receives data DATA to be stored from an external controller (not illustrated).

The data I/O circuit 124 outputs data transferred from the first to m-th page buffers PB1 to PBm, which are included in the read and write circuit 123, to the external controller during a read operation.

The control logic 125 is coupled to the address decoder 121, the voltage generator 122, the read and write circuit 123, and the data I/O circuit 124. The control logic 125 may control the overall operation of the semiconductor memory device 100. The control logic 125 receives a command CMD and an address ADDR from the external controller. The control logic 125 may control the address decoder 121, the voltage generator 122, the read and write circuit 123, and the data I/O circuit 124 in response to the command CMD. The control logic 125 transfers the address ADDR to the address decoder 121.

The control logic 125 may perform a program operation by controlling the address decoder 121, the voltage generator 122, and the read and write circuit 123. The control logic 125 may control the address decoder 121, voltage generator 122, and the read and write circuit 123 so that voltages required for the program operation are applied to word lines and bit lines while a program operation is performed.

In accordance with an embodiment of the present disclosure, the control logic 125 may control the peripheral circuit so that a primary program operation and a secondary program operation are performed. More specifically, in the primary program operation, the program operation is performed such that a single verification voltage is used for the highest threshold voltage program state (i.e., the highest threshold voltage distribution) and two or more verification voltages are used for the remaining program states (i.e., the remaining threshold voltage distributions). Here, for the remaining program states, a double verify operation, which is a verify operation that uses two verification voltages, may be performed. In a secondary program operation, a reprogram operation is performed for the highest threshold voltage program state.

For example, it is assumed that a program state each memory cell may have is any one of first to $n_{max}$-th program states. Then, in the primary program operation, a verify operation may be performed using a first verification voltage (also referred to as a "pre-verification voltage") and a second verification voltage (also referred to as a "main verification voltage") for the first to $n_{max}-1$-th program states, and a verify operation may be performed using a primary verification voltage, which is a single verification voltage for the $n_{max}$-th program state (i.e., the highest threshold voltage program state). Here, the primary verification voltage for the $n_{max}$-th program state may have a voltage level between a main verification voltage for the $n_{max}-1$-th program state and a main verification voltage for the $n_{max}$-th program state. Thereafter, with respect to the memory cells to be programmed to the $n_{max}$-th program state, if those memory cells have passed the program verification using the primary verification voltage, a reprogram operation is performed on those memory cells by using a secondary verification voltage. Here, the secondary verification voltage may be a main verification voltage for the $n_{max}$-th program state.

Alternatively, for all program states (e.g., not only the first to $n_{max}-1$-th program states, but also the $n_{max}$-th program state) a program operation may be performed based on a double verify method, but the program operation based on the double verify operation may be performed until the memory cells to be programmed to the second highest program state has passed the program verification, and thereafter a reprogram operation may be performed for the highest threshold voltage program state.

For example, it is assumed that the program state the memory cell may have is one of the first to $n_{max}$-th program states. Then, a program operation may be performed not only on the memory cells to be programmed to the first to $n_{max}-1$-th program states, but also on the memory cells to be programmed to the $n_{max}$-th program state, using the double verify method until the memory cells to be programmed to the $n_{max}-1$-th program state have passed the program verifications. If the memory cells to be programmed to the $n_{max}-1$-th program state have passed the program verifications, a reprogram operation may be performed on the memory cells to be programmed to the $n_{max}$-th program state. In the reprogram operation for the $n_{max}$-th program state, a program operation is performed using a single verification voltage.

Various embodiment of the present disclosure may be applied not only to a program operation that uses a double verify method, but also to a program operation using a verify method that uses three or more verification voltages for each program state.

Figure 4:
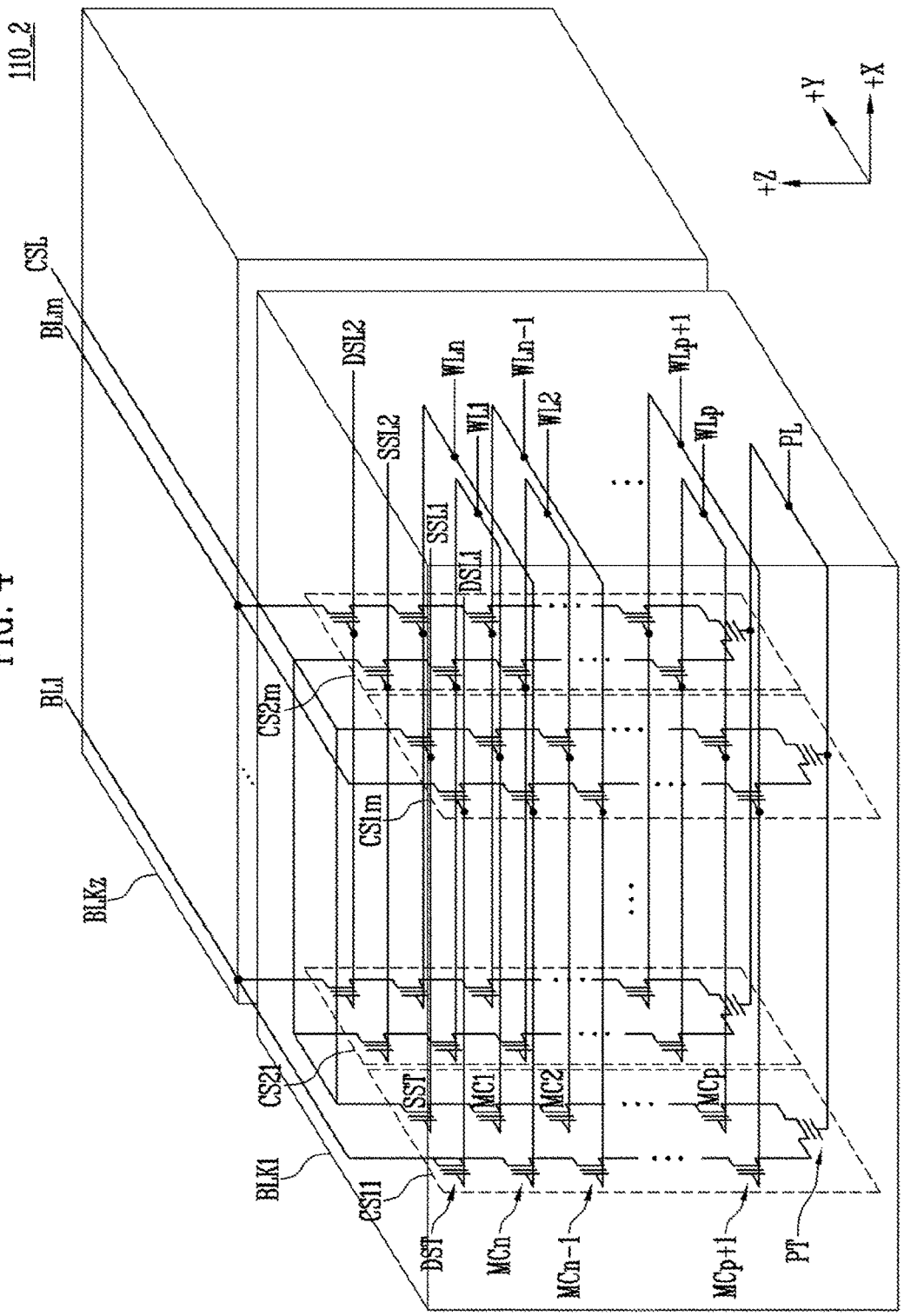
FIG. 4 is a diagram illustrating an example of the memory cell array of FIG. 2.

FIG. 4 is a diagram illustrating an example of the memory cell array 110 of FIG. 2.

Referring to FIG. 4, a memory cell array 110_2 includes a plurality of memory blocks BLK1 to BLKz. In FIG. 4, for the convenience of description, the internal configuration of the first memory block BLK1 is illustrated, and the internal configuration of the remaining memory blocks BLK2 to BLKz is omitted. It will be understood that the second to z-th memory blocks BLK2 to BLKz are configured in the same way as the first memory block BLK1.

Referring to FIG. 4, the first memory block BLK1 includes a plurality of cell strings CS11 to CS1m and CS21 to CS2m. In an embodiment, each of the cell strings CS11 to CS1m and CS21 to CS2m may be formed in a 'U' shape. In the first memory block BLK1, m cell strings are arranged in a row direction (i.e. a positive (+) X direction). In FIG. 4, two cell strings are illustrated as being arranged in a column direction (i.e. a positive (+) Y direction). However, this illustration is made for convenience of description, and it should be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

The select transistors SST and DST and the memory cells MC1 to MCn may have similar structures to each other. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided to each cell string. In an embodiment, a pillar for providing at least one of the channel layer, the tunneling insulating layer, the charge storage layer, and the blocking insulating layer may be provided to each cell string.

The source select transistor SST of each cell string is connected between the common source line CSL and memory cells MC1 to MCp.

In an embodiment, the source select transistors of cell strings arranged in the same row are connected to a source select line extending in a row direction, and source select transistors of cell strings arranged in different rows are connected to different source select lines. In FIG. 4, source select transistors of cell strings CS11 to CS1m in a first row are coupled to a first source select line SSL1. The source select transistors of cell strings CS21 to CS2m in a second row are coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string are connected between the source select transistor SST and the drain select transistor DST.

The first to n-th memory cells MC1 to MCn may be divided into a group of first to p-th memory cells MC1 to MCp and a group of p+1-th to n-th memory cells MCp+1 to MCn. The first to p-th memory cells MC1 to MCp are sequentially arranged in a direction opposite the +Z direction, and are connected in series between the source select transistor SST and the pipe transistor PT. The p+1-th to n-th memory cells MCp+1 to MCn are sequentially arranged in the +Z direction, and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1 is improved.

The gate of the pipe transistor PT of each cell string is coupled to a pipeline PL.

The drain select transistor DST of each cell string is connected between the corresponding bit line and the memory cells MCp+1 to MCn. The cell strings in a row direction are coupled to drain select lines extending in a row direction. Drain select transistors of cell strings CS11 to CS1m in the first row are coupled to a first drain select line DSL1. Drain select transistors of cell strings CS21 to CS2m in a second row are coupled to a second drain select line DSL2.

Cell strings arranged in a column direction are coupled to bit lines extending in a column direction. In FIG. 4, cell strings CS11 and CS21 in a first column are coupled to a first bit line BL1. Cell strings CS1m and CS2m in an m-th column are coupled to an m-th bit line BLm.

The memory cells coupled to the same word line and arranged in a row direction may constitute a single page. For example, memory cells coupled to the first word line WL1, among memory cells of cell strings CS11 to CS1m, and arranged in the first row may constitute a single page. Memory cells coupled to the first word line WL1, among memory cells of the cell strings CS21 to CS2m, and arranged in the second row may constitute a single additional page. Cell strings arranged in the direction of a single row may be selected by selecting any one of the drain select lines DSL1 and DSL2. A single page may be selected from the selected cell strings by selecting any one of the word lines WL1 to WLn.

Figure 5:
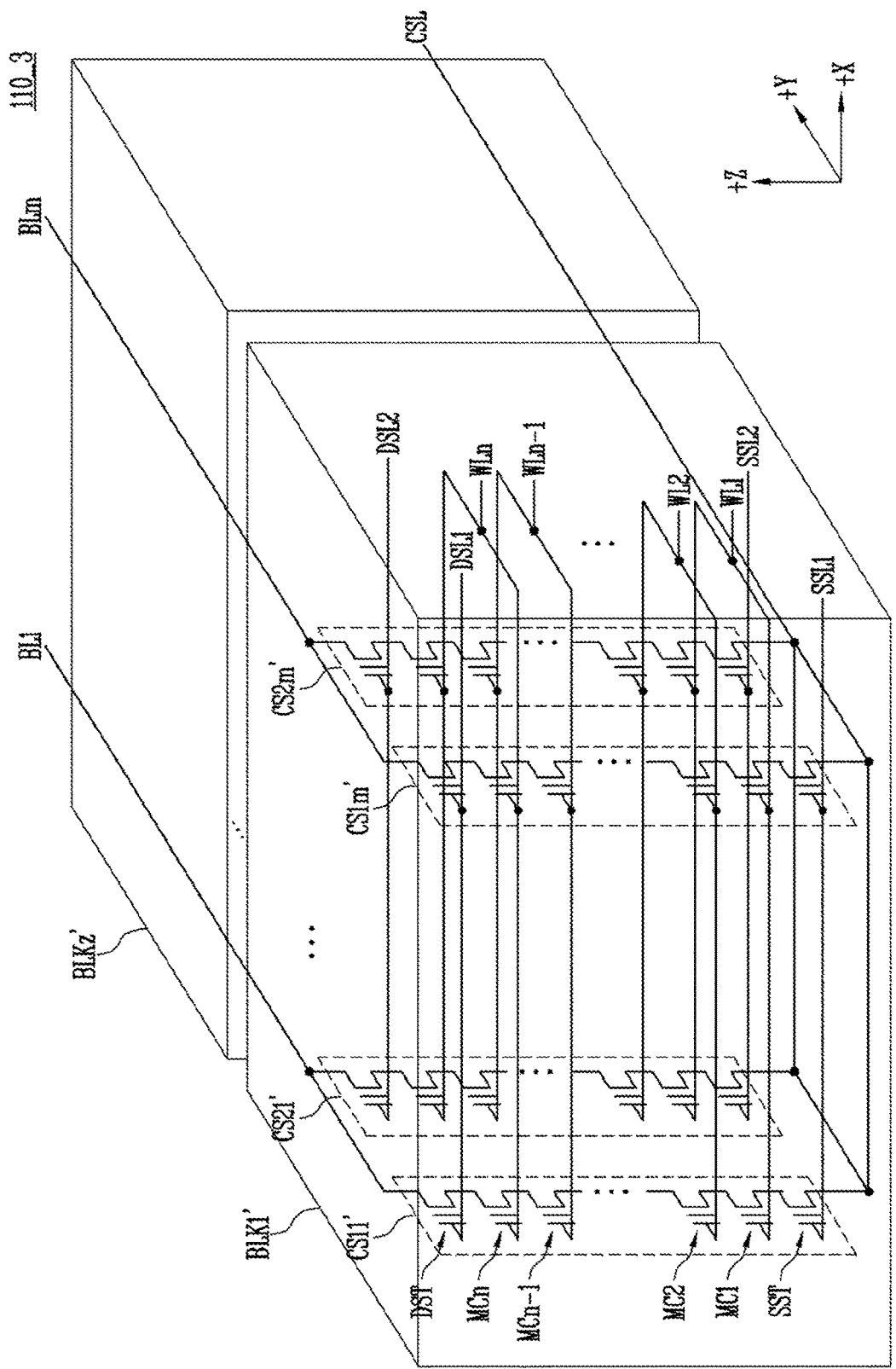
FIG. 5 is a diagram illustrating an example of the memory cell array of FIG. 2.

FIG. 5 is a diagram illustrating an example of the memory cell array 110 of FIG. 2.

Referring to FIG. 5, a memory cell array 110_3 includes a plurality of memory blocks BLK1' to BLKz'. In FIG. 5, for the convenience of description, the internal configuration of the first memory block BLK1' is illustrated, and the illustration of the internal configuration of the remaining memory blocks BLK2' to BLKz' is omitted. It will be understood that the second to z-th memory blocks BLK2' to BLKz' are configured in the same way as the first memory block BLK1'.

The first memory block BLK1' includes a plurality of cell strings CS11' to CS1m' and CS21' to CS2m'. Each of the plurality of cell strings CS11' to CS1m' and CS21' to CS2m' extends along a +Z direction. In the first memory block BLK1, m cell strings are arranged in a +X direction. In FIG. 5, two cell strings are illustrated as being arranged in a +Y direction. However, this configuration is made for the convenience of description, and it should be understood that three or more cell strings may be arranged in a column direction.

Each of the cell strings CS11' to CS1m' and CS21' to CS2m' includes at least one source select transistor SST, first to n-th memory cells MC1 to MCn, and at least one drain select transistor DST.

The source select transistor SST of each cell string is connected between a common source line CSL and memory cells MC1 to MCn. The source select transistors of cell strings arranged in the same row are connected to the same source select line. Source select transistors of cell strings CS11' to CS1m' arranged in the first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are connected to first to n-th word lines WL1 to WLn.

In an embodiment, at least one of the first to n-th memory cells MC1 to MCn may be used as a dummy memory cell. When the dummy memory cell is provided, the voltage or current of the corresponding cell string may be stably controlled. Accordingly, the reliability of data stored in the memory block BLK1' is improved.

The drain select transistor DST of each cell string is connected between the corresponding bit line and the memory cells MC1 to MCn. Drain select transistors of cell strings arranged in a row direction are coupled to drain select lines extending in a row direction. The drain select transistors of the cell strings CS11' to CS1m' in the first row are connected to a first drain select line DSL1. The drain select transistors of the cell strings CS21' to CS2m' in the second row are coupled to a second drain select line DSL2.

As a result, the memory block BLK1' of FIG. 5 has an equivalent circuit similar to that of the memory block BLK1 of FIG. 4 except that a pipe transistor PT is excluded from each cell string.

FIG. 6 is a diagram illustrating an example of a program operation that is performed based on a double verify method.

Before a program operation is performed, selected memory cells have threshold voltages corresponding to an erase state ERASE. For example, the range of threshold voltages corresponding to the erase state may be the range of voltages lower than a ground voltage. Each of the selected memory cells in the semiconductor memory device may be programmed to one of a plurality of program states, depending on data to be programmed. More specifically, each of the selected memory cells may be programmed to a threshold voltage distribution corresponding to any one of first to n-th program states PV1 to PVn.

The program operation of storing data in the memory cells may be performed by executing a plurality of program loops. Each program loop may be divided into a program pulse application operation applying a program pulse to a selected word line and a program pulse application operation and a program verify operation verifying a program state. In an embodiment, the program operation may be performed using an Incremental Step Pulse Programming (ISPP) method in which, whenever the program loop is repeated, the voltage of the program pulse is increased by a step voltage.

When a program verify operation is performed on the selected memory cells, a double verify operation that uses two verification voltages may be applied to each of the program loops.

Referring to FIG. 6, the selected memory cells are assumed to have a certain program state (x-th program state), among the first to n-th program states PVn, as a target program state. The double verify operation is performed such that, after the program pulse has been applied to the selected memory cells, the threshold voltages of memory cells are detected twice using a second verification voltage Vvfy2, which is a verification voltage for the target program state, and a first verification voltage Vvfy1, which is lower than the second verification voltage. Based on the results of the detection, the memory cells may be divided into first memory cells (1), second memory cells (2), and third memory cells (3). Here, the first memory cells (1) may have the threshold voltages that are lower than the first verification voltage. The second memory cells (2) may have the threshold voltages that are higher than the first verification voltage and are lower than the second verification voltage. The third memory cells (3) may have the threshold voltages that are higher than the second verification voltage. In an embodiment, the first verification voltage may be a pre-verification voltage, and the second verification voltage may be a main verification voltage.

When the program pulse is applied to a selected word line during a subsequent program loop, a program permission voltage may be applied to bit lines coupled to the first memory cells (1). The threshold voltages of the first memory cells may be increased with the application of the program pulse. A program prohibition voltage may be applied to bit lines coupled to the third memory cells (3). The threshold voltages of the third memory cells may not be increased even if the program pulse is applied. The second memory cells (2) have threshold voltages that are higher than the first verification voltage Vvfy1 and are lower than the second verification voltage Vvfy2. A program control voltage that is higher than the program permission voltage and is lower than the program prohibition voltage may be applied to bit lines coupled to the second memory cells (2) so as to reduce the increase in the threshold voltages of memory cells depending on the application of the program pulse.

When each memory cell is implemented as a quad-level cell (QLC) for storing four data bits in a single memory cell, the memory cell may have an erase state or any one of first to 15-th program states PV1 to PV15 after the program operation is performed. Therefore, when a double verify-based program operation is performed for all program states, an overall program time tPROG may increase. Therefore, in an embodiment, in order to omit an unnecessary double verify operation, only a single verification voltage may be used for the 15-th program state PV15, which is the highest program state. In this case, however, there is a possibility that a threshold voltage distribution for the 15-th program state PV15 is widened.

In accordance with an embodiment of the present disclosure, memory cells may be programmed through a primary program operation and a secondary program operation. More specifically, in the primary program operation, the program verify operation is performed using a single verification voltage for the highest threshold voltage program state, and the program verify operation is performed using a plurality of verification voltages for the remaining program states. Here, for the remaining program states, a double verify operation, which is a verify operation that uses two verification voltages may be performed. In the secondary program operation, a reprogram operation is performed for the highest threshold voltage program state.

For example, it is assumed that a program state each memory cell may have is one of first to $n_{max}$-th program states. Then, in the primary program operation, a verify operation may be performed using a first verification voltage (also referred to as a "pre-verification voltage") and a second verification voltage (also referred to as a "main verification voltage") for the first to $n_{max}-1$-th program states, and a verify operation may be performed using a primary verification voltage that is a single verification voltage for the $n_{max}$-th program state (i.e., the highest threshold voltage program state). Here, the primary verification voltage for the $n_{max}$-th program state may have a voltage level between a main verification voltage for the $n_{max}-1$-th program state and a main verification voltage for the $n_{max}$-th program state. Thereafter, with respect to the memory cells to be programmed to the $n_{max}$-th program state, if those memory cells have passed the program verification using the primary verification voltage, a reprogram operation is performed on those memory cells by using a secondary verification voltage. Here, the secondary verification voltage may be a main verification voltage for the $n_{max}$-th program state.

Alternatively, for all program states (e.g., not only the first to $n_{max}-1$-th program states, but also the $n_{max}$-th program state) a program operation may be performed based on a double verify method. However, such a program operation based on a double verify operation is performed until the memory cells to be programmed to the second highest program state has passed the program verification. Thereafter, a reprogram operation may be performed for the highest threshold voltage program state.

For example, it is assumed that the program state the memory cell may have is one of the first to $n_{max}$-th program states. Then, a program operation may be performed not only on the memory cells to be programmed to the first to $n_{max}-1$-th program states, but also on the memory cells to be programmed to the $n_{max}$-th program state, using the double verify method until the memory cells to be programmed to the $n_{max}-1$-th program state have passed the program verifications. If the memory cells to be programmed to the $n_{max}-1$-th program state have passed the program verifications, a reprogram operation may be performed on the memory cells to be programmed to the $n_{max}$-th program state. In the reprogram operation for the $n_{max}$-th program state, a program operation is performed using a single verification voltage.

Various embodiment of the present disclosure may be applied not only to a program operation that uses a double verify method, but also to a program operation using a verify method that uses three or more verification voltages for each program state.

Various embodiment of the present disclosure may also be applied to a case where each memory cell is implemented as a multi-level cell (MLC) for storing two data bits, a case where each memory cell is implemented as a triple-level cell (TLC) for storing three data bits, and a case where the memory cell is implemented as a quad-level cell (QLC) for storing four data bits. Various embodiment of the present disclosure may also be applied to a case where each memory cell stores five or more data bits.

FIG. 7 is a diagram illustrating an example of a verification voltage used in a method of operating the semiconductor memory device according to an embodiment of the present disclosure.

Referring to FIG. 7, the semiconductor memory device may program memory cells using a primary program operation and a secondary program operation. More specifically, in the primary program operation, for a highest threshold voltage program state, a program verify operation is performed using a single verification voltage, and for the remaining program states, the program verify operation is performed using a plurality of verification voltages. Here, for the remaining program states, a double verify operation that uses two verification voltages may be performed. In the secondary program operation, a reprogram operation is performed for the highest threshold voltage program state.

FIG. 7 illustrates a primary verification voltage used as the verification voltage for the highest threshold voltage program state in a primary program operation. For example, it is assumed that the semiconductor memory device may program the memory cells so that memory cells have any one of first to N-th program states using a double verify operation. The double verify operation may be performed using a pre-verification voltage and a main verification voltage.

In accordance with an embodiment of the present disclosure, a primary verification voltage PV(N) Verify may be a verification voltage for the N-th program state, which is the highest threshold voltage program state, and may be identical to a main verification voltage PV(N−1) Main for the N−1-th program state. In an embodiment, the primary verification voltage PV(N) Verify required to verify the N-th program state may have a voltage value between the main verification voltage for the N−1-th program state and the main verification voltage for the N-th program state.

Figure 8:
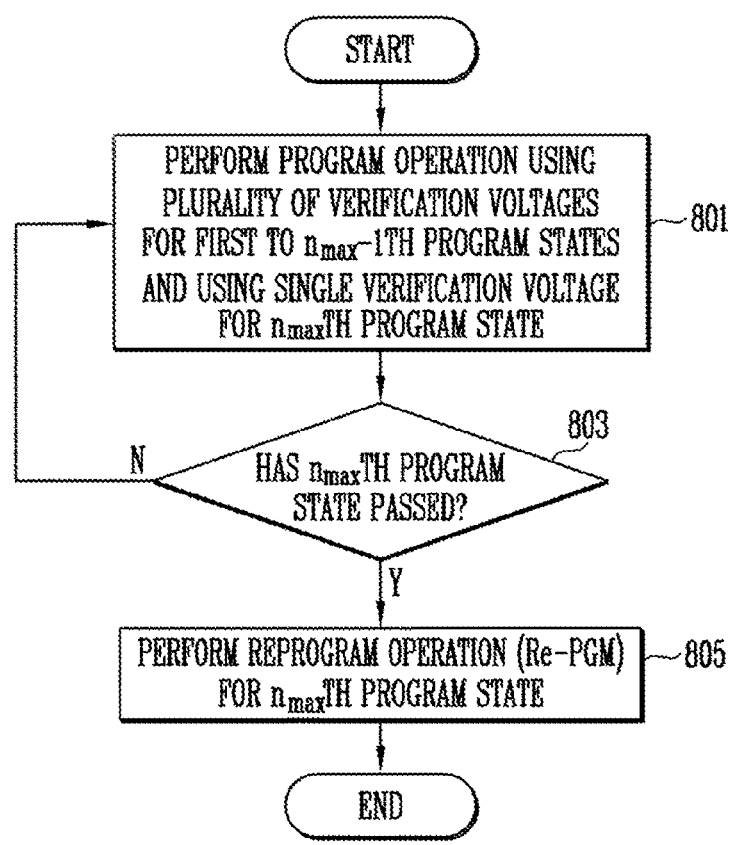
FIG. 8 is a flowchart illustrating an example of a method of operating a semiconductor memory device according to an embodiment of the present disclosure.

FIG. 8 is a flowchart illustrating an example of a method of operating a semiconductor memory device according to an embodiment of the present disclosure.

Referring to FIG. 8, the semiconductor memory device may perform a primary program operation and a secondary program operation. Steps 801 to 803 may correspond to the primary program operation and step 805 may correspond to the secondary program operation.

At step 801, the semiconductor memory device may perform a program operation using a plurality of verification voltages for first to $n_{max}-1$-th program states and using a single verification voltage for an $n_{max}$-th program state. In an embodiment, the plurality of verification voltages for the first to $n_{max}-1$-th program states may be a pre-verification voltage and a main verification voltage. The verification voltage for the $n_{max}$-th program state may be the primary verification voltage. In an embodiment, the primary verification voltage may be equal to or higher than the main verification voltage for the $n_{max}-1$-th program state and may be lower than the main verification voltage for the $n_{max}$-th program state.

At step 803, it may be determined whether the memory cells to be programmed to the $n_{max}$-th program state have passed the program verification. If the memory cells to be programmed to the $n_{max}$-th program state have passed the program verification, it may be determined that the primary program operation has been completed, and the semiconductor memory device proceeds to step 805. If the memory cells to be programmed to the $n_{max}$-th program state fail to pass the program verification, the process returns to step 801.

At step 805, the semiconductor memory device may perform a reprogram operation for the $n_{max}$-th program state. In the reprogram operation, a verification voltage for the $n_{max}$-th program state may be a secondary verification voltage. The secondary verification voltage used here may be the main verification voltage for the $n_{max}$-th program state.

Figure 9:
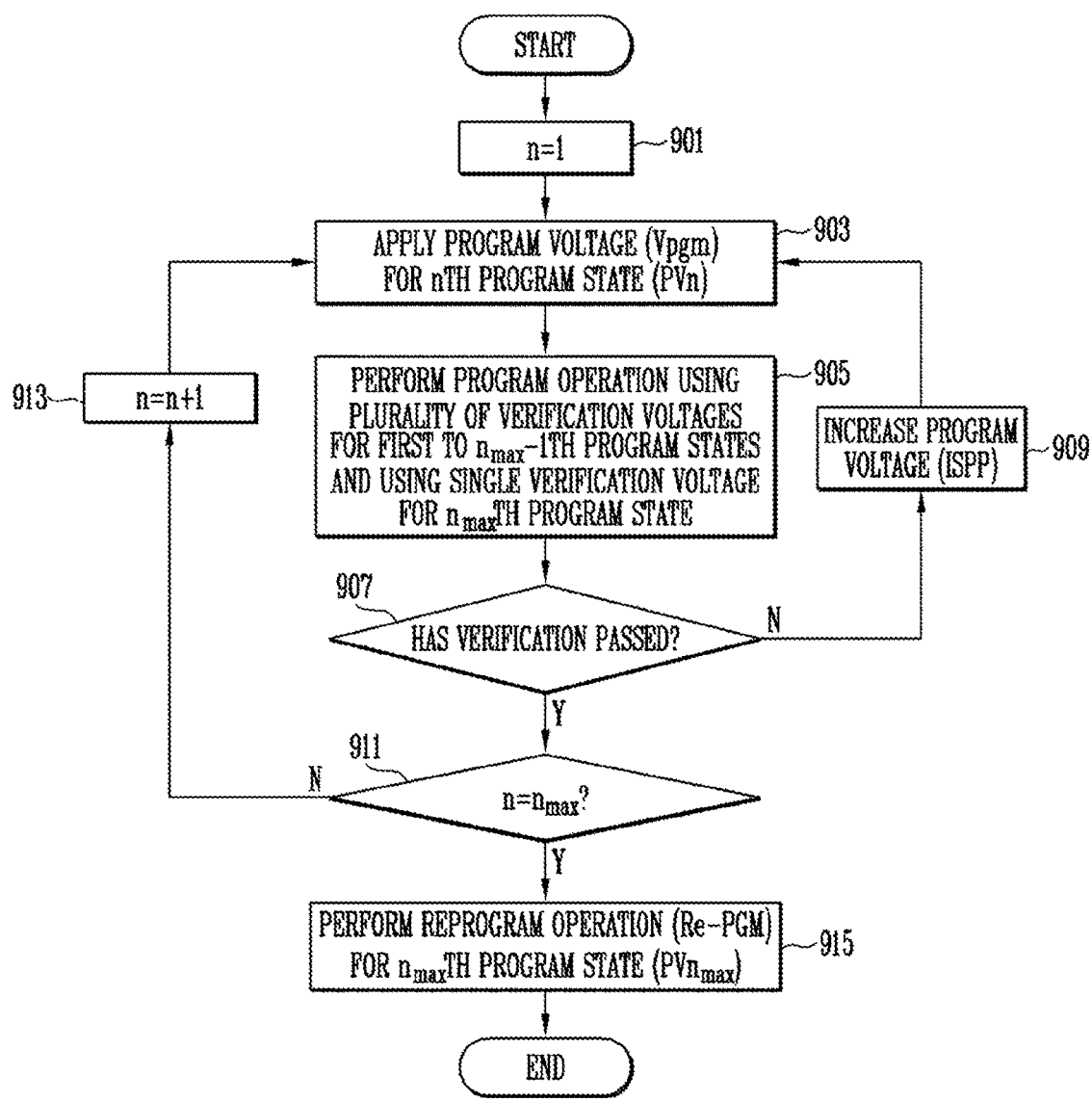
FIG. 9 is a flowchart illustrating in detail an example of the method of operating the semiconductor memory device, illustrated in FIG. 8.

FIG. 9 is a flowchart illustrating in detail an example of the method of operating the semiconductor memory device, illustrated in FIG. 8.

Referring to FIG. 9, the semiconductor memory device may perform a program operation for first to $n_{max}$-th program states. Here, $n_{max}$ may be three (3) when the memory cell of the semiconductor memory device is a multi-level cell (MLC), may be seven (7) when the memory cell is a triple-level cell (TLC), and may be fifteen (15) when the memory cell is a quad-level cell (QLC).

At step 901, the semiconductor memory device may perform a program operation in a case where n is equal to one (1). That is, a program operation may be performed on memory cells to be programmed to the first program state.

At step 903, the semiconductor memory device may apply a program voltage Vpgm to a selected word line so as to perform a program operation on memory cells to be programmed to an n-th program state PVn. The memory cells coupled to the selected word line may constitute a page, and the program operation may be performed on a page basis.

At step 905, the semiconductor memory device may apply a plurality of verification voltages to memory cells to be programmed to the first to $n_{max}-1$-th program states, and may apply a single verification voltage to memory cells to be programmed to the $n_{max}$-th program state. In an embodiment, the plurality of verification voltages for the first to $n_{max}-1$-th program states may be a pre-verification voltage and a main verification voltage. The verification voltage for the $n_{max}$-th program state may be a primary verification voltage. In an embodiment, the primary verification voltage may be equal to or higher than a main verification voltage for the $n_{max}-1$-th program state, and may be lower than a main verification voltage for the $n_{max}$-th program state.

At step 907, it may be determined whether the memory cells have passed the program verification. If the memory cells fail to pass the program verification, the semiconductor memory device proceeds to step 909 where the program voltage is increased by a step voltage, and then returns to step 903 where the program voltage may be applied to the selected word line. At step 907, when the memory cells have passed the program verification, the semiconductor memory device proceeds to step 911.

At step 911, it may be determined whether a program state where the current program operation has been completed is a preset program state. Here, the preset program state may be the highest threshold voltage program state (i.e., the highest threshold voltage distribution). That is, when a memory cell is programmed to any one of the first to $n_{max}$-th program states, the preset program state may be the $n_{max}$-th program state. The semiconductor memory device determines whether the program state of the memory cells that have passed the program verification at step 907 is the $n_{max}$-th program state. If it is determined that the program state is the $n_{max}$-th program state, the semiconductor memory device proceeds to step 915, otherwise the semiconductor memory device proceeds to step 913 where a program operation for a subsequent program state is performed.

At step 915, if the program state of the memory cells that have passed the program verification is the $n_{max}$-th program state, the semiconductor memory device may perform a program operation for the $n_{max}$-th program state based on a reprogram method. Such a reprogram method will be described in detail later with reference to FIG. 10.

In an embodiment, steps 901 to 911 may correspond to the primary program operation, described in the embodiment of FIG. 8. Further, step 915 may correspond to the secondary program operation.

Accordingly, when the memory cells to be programmed to the $n_{max}$-th program state have passed the program verification using a primary verify operation at step 907, a threshold voltage distribution of memory cells to be programmed to the $n_{max}$-th program state may be present between the primary verification voltage and the threshold voltage distribution of the $n_{max}$-th program state. Thereafter, at step 915, the semiconductor memory device performs a program operation for the $n_{max}$-th program state based on a reprogram method that uses the main verification voltage for the $n_{max}$-th program state, thus causing the threshold voltage distribution for the $n_{max}$-th program state to be narrowed.

Figure 10:
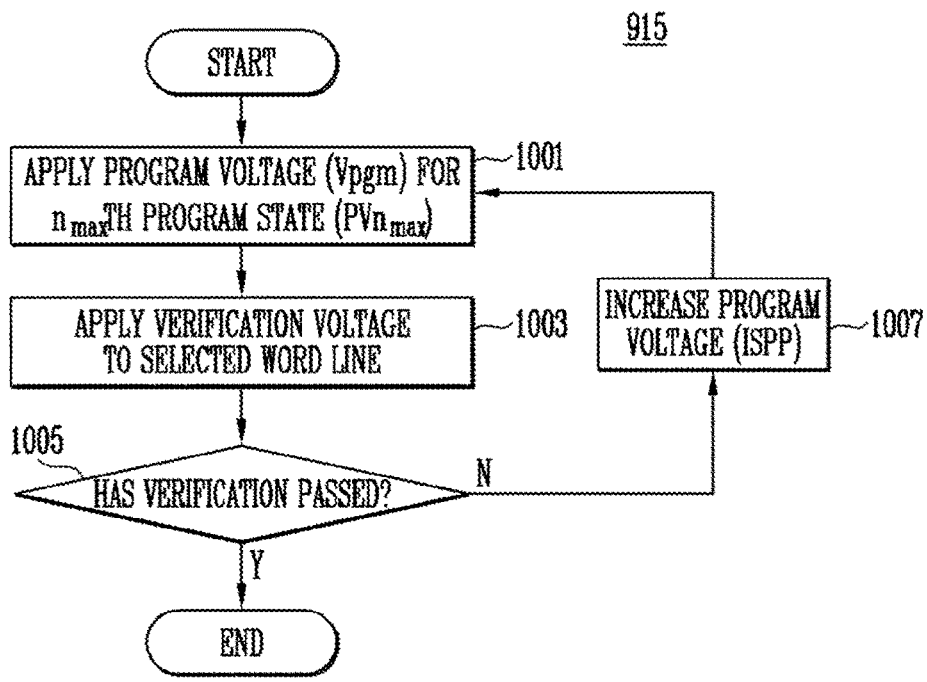
FIG. 10 is a flowchart illustrating an example of a reprogram method of FIG. 9.

FIG. 10 is a flowchart illustrating an example of the reprogram method (step 915) of FIG. 9.

Referring to FIG. 10, at step 1001, the semiconductor memory device may apply a program voltage to a selected word line coupled to memory cells to be programmed to an $n_{max}$-th program state $PVn_{max}$.

At step 1003, the semiconductor memory device applies a verification voltage to the selected word line. Here, the applied verification voltage may be a secondary verification voltage, which is a main verification voltage for the $n_{max}$-th program state $PVn_{max}$.

At step 1005, it may be determined whether the memory cells have passed the program verification. If it is determined that the verify operation has passed, the semiconductor memory device terminates the program operation, whereas if it is determined that the memory cells have failed to pass the program verification, the semiconductor memory device proceeds to step 1007 where the program voltage is increased by a step voltage, and then returns to step 1001 where the program voltage may be applied.

In an embodiment, at step 1007, the semiconductor memory device may increase a time during which the program voltage is applied, without increasing the program voltage.

In FIGS. 9 and 10, a double verify operation is not performed on the memory cells to be programmed to the $n_{max}$-th program state $PVn_{max}$, and a reprogram operation using a single verification voltage is performed on the memory cells. Therefore, the memory cells to be programmed to the $n_{max}$-th program state $PVn_{max}$ are programmed based on the primary program operation at steps 901 to 911 of FIG. 9, and are reprogrammed (re-PGM) according to the embodiment of FIG. 10. In this way, a program time (tPROG) may be shortened and threshold voltage distributions may be narrowed, compared to the case where a double verify operation is performed for all program states, and thus reliability may be improved.

Figure 11:
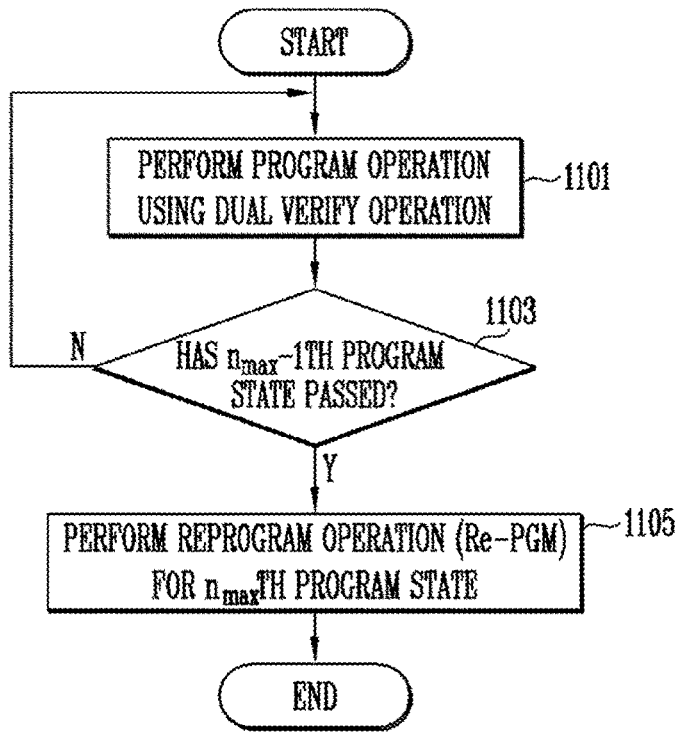
FIG. 11 is a flowchart illustrating an example of a method of operating a semiconductor memory device according to an embodiment of the present disclosure.

FIG. 11 is a flowchart illustrating an example of a method of operating a semiconductor memory device according to an embodiment of the present disclosure.

Referring to FIG. 11, at step 1101, the semiconductor memory device performs a program operation using a double verify method. Each of a plurality of program states may have a pre-verification voltage and a main verification voltage.

At step 1103, it may be determined whether the memory cells to be programmed to an $n_{max}-1$-th program state have passed the program verification. If it is determined that the memory cells to be programmed to the $n_{max}-1$-th program state have passed the program verification, the semiconductor memory device proceeds to step 1105, whereas if it is determined that the memory cells to be programmed to the $n_{max}-1$-th program state has not passed the program verification, the semiconductor memory device returns to step 1101 where the program operation is performed.

At step 1105, the semiconductor memory device may perform a reprogram operation for an $n_{max}$-th program state. The reprogram operation for the $n_{max}$-th program state will be described in detail below with reference to FIG. 12.

Figure 12:
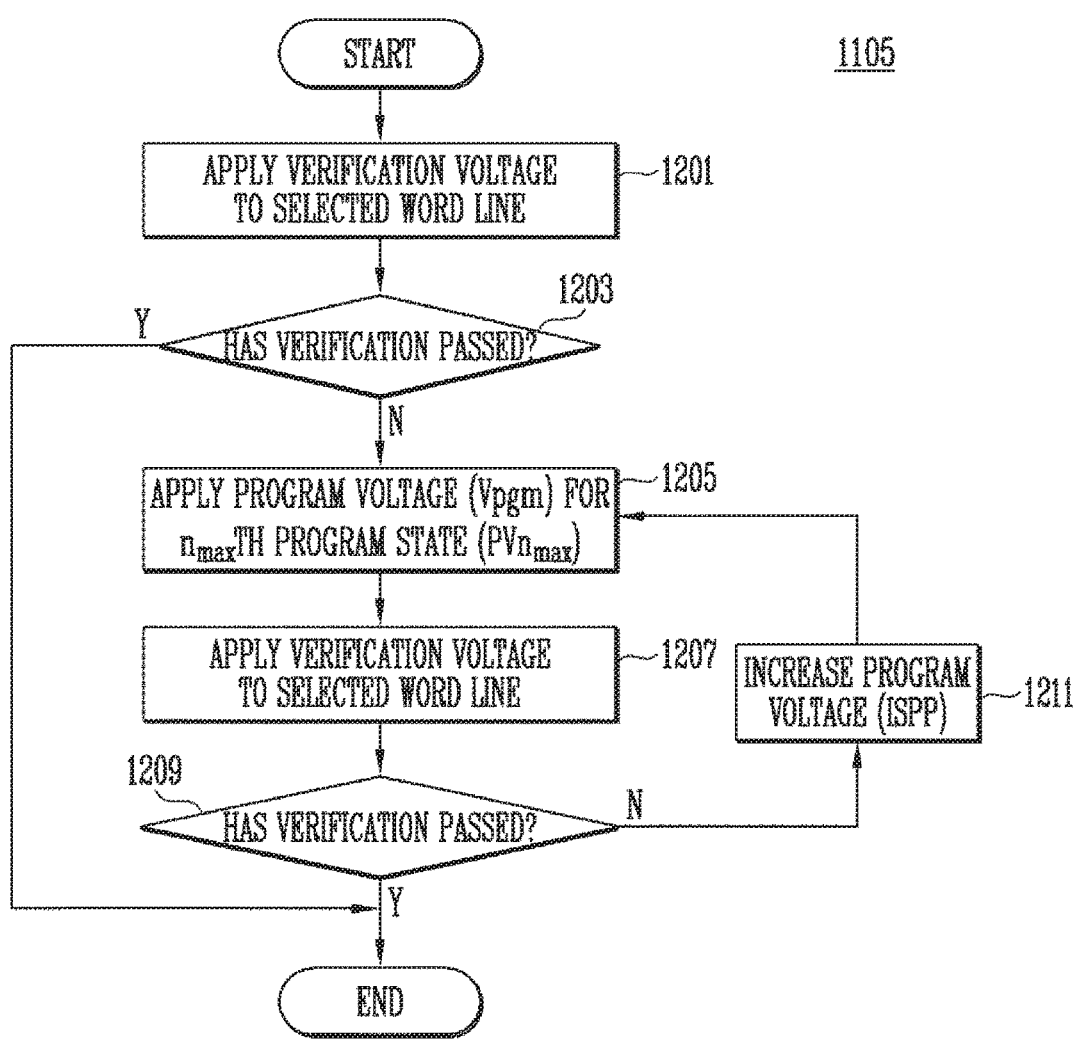
FIG. 12 is a flowchart illustrating an example of a reprogram operation of FIG. 11.

FIG. 12 is a flowchart illustrating an example of the reprogram operation 1105 of FIG. 11.

Referring to FIG. 12, at step 1101, the semiconductor memory device applies a verification voltage to a selected word line. The applied verification voltage may be the main verification voltage for the $n_{max}$-th program state $PVn_{max}$.

At step 1203, it may be determined whether the memory cells have passed the program verification. If it is determined that the memory cells have passed the program verification, the semiconductor memory device terminates the program operation, whereas if it is determined that the memory cells have not passed the program verification, the semiconductor memory device proceeds to step 1205.

In FIG. 12, the verify operation is first performed at step 1201, and it is determined whether the program operation for the $n_{max}$-th program state $PVn_{max}$ has been completed, and a reprogram operation is performed for the $n_{max}$-th program state $PVn_{max}$ only if the memory cells have failed to pass the program verification (virtual re-PGM).

At step 1205, the semiconductor memory device may apply a program voltage for the $n_{max}$-th program state $PVn_{max}$ to the selected word line.

At step 1207, the semiconductor memory device applies a verification voltage to a selected word line. Here, the applied verification voltage may be a main verification voltage for the $n_{max}$-th program state $PVn_{max}$.

At step 1209, it may be determined whether the memory cells have passed the program verification. If it is determined that the memory cells have passed the program verification, the semiconductor memory device terminates the program operation, whereas if it is determined that the memory cells have not passed the program verification, the semiconductor memory device proceeds to step 1211 where the program voltage is increased by a step voltage, and then returns to step 1205 where the program voltage may be applied.

In an embodiment, at step 1211, the semiconductor memory device may increase a time during which the program voltage is applied, without increasing the program voltage.

In FIGS. 11 and 12, a double verify operation is performed on memory cells to be programmed to the $n_{max}$-th program state $PVn_{max}$ until memory cells to be programmed to the $n_{max}$-1-th program state pass the program verification, and after the memory cells to be programmed to the $n_{max}$-1-th program state have passed the program verification, the memory cells to be programmed to the $n_{max}$-th program state are programmed using a single verification voltage. Therefore, the memory cells to be programmed to the $n_{max}$-th program state $PVn_{max}$ may be programmed at steps 1101 and 1103 of FIG. 11, and may then be reprogrammed (re-PGM) according to the embodiment of FIG. 12. In this way, the program time (tPROG) may be shortened and threshold voltage distributions may be narrowed compared to a case where a double verify operation is performed for all program states, and thus reliability may be improved.

Figure 13:
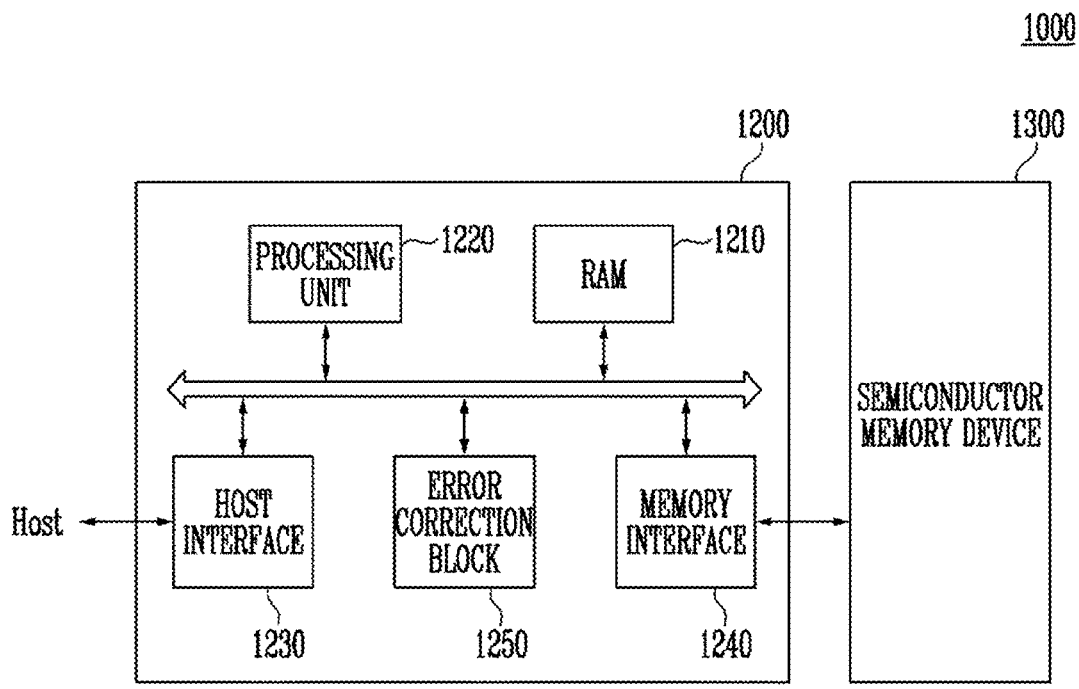
FIG. 13 is a diagram illustrating an example of a memory system including the semiconductor memory device of FIG. 2.

FIG. 13 is a diagram illustrating an example of a memory system including the semiconductor memory device of FIG. 2.

Referring to FIG. 13, the memory system 1000 includes a semiconductor memory device 1300 and a controller 1200.

The semiconductor memory device 1300 may have the same configuration and may operate in the same way as those of the semiconductor memory device 100 described with reference to FIG. 2. Hereinafter, repetitive explanations will be omitted.

The controller 1200 is coupled to a host Host and the semiconductor memory device 1300. The controller 1200 may access the semiconductor memory device 1300 in response to a request from the host Host. For example, the controller 1200 may control read, write, erase, and background operations of the semiconductor memory device 1300. The controller 1200 may provide an interface between the host Host and the semiconductor memory device 1300.

The controller 1200 may run firmware for controlling the semiconductor memory device 1300.

The controller 1200 includes a RAM (Random Access Memory) 1210, a processing unit 1220, a host interface 1230, a memory interface 1240, and an error correction block 1250.

The RAM 1210 is used as at least one of an operation memory of the processing unit 1220, a cache memory between the semiconductor memory device 1300 and the host Host, and a buffer memory between the semiconductor memory device 1300 and the host Host.

The processing unit 1220 controls the overall operation of the controller 1200.

The processing unit 1220 may randomize data received from the host Host. For example, the processing unit 1220 may randomize the data received from the host Host using a randomizing seed. The randomized data is provided, as data to be stored, to the semiconductor memory device 1300 and is then written in the memory cell array.

The processing unit 1220 may derandomize the data received from the semiconductor memory device 1300 during a read operation. For example, the processing unit 1220 may derandomize the data received from the semiconductor memory device 1300 using a derandomizing seed. The derandomized data may be output to the host Host.

In an embodiment, the processing unit 1220 may perform randomize and derandomize operations by running software or firmware.

The host interface 1230 includes a protocol for performing data exchange between the host Host and the controller 1200. In an embodiment, the controller 1200 may communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1240 interfaces with the semiconductor memory device 1300. For example, the memory interface includes a NAND interface or NOR interface.

The error correction block 1250 uses an error correcting code (ECC) to detect and correct an error in data received from the semiconductor memory device 1300.

The controller 1200 and the semiconductor memory device 1300 may be integrated into a single semiconductor device. In an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1200 and the semiconductor memory device 1300 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 1300 or the memory system 1000 may be embedded in various types of packages. For example, the semiconductor memory device 1300 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), Wafer-Level Processed Stack Package (WSP), or the like.

Figure 14:
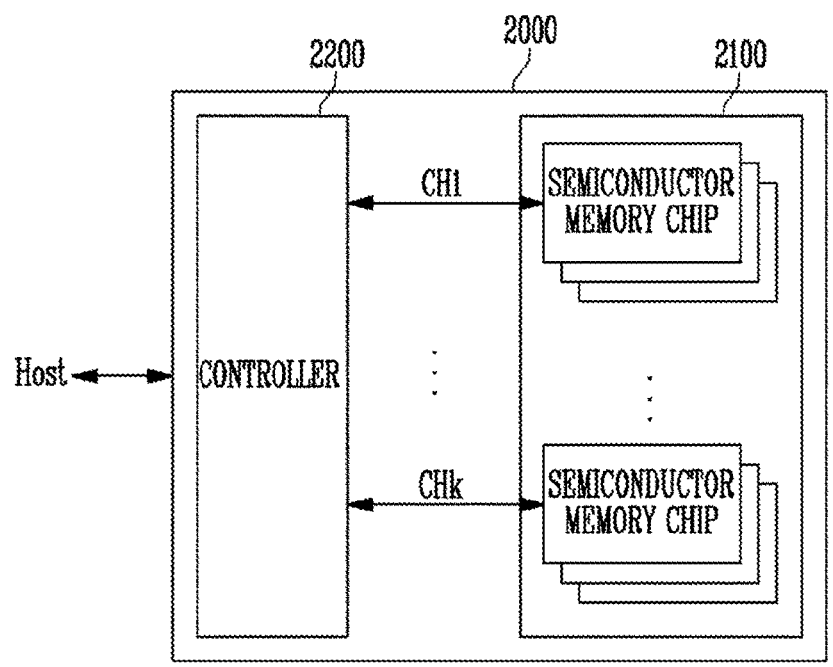
FIG. 14 is a diagram illustrating an example of application of the memory system of FIG. 13.

FIG. 14 is a diagram illustrating an example of application of the memory system of FIG. 13.

In detail, FIG. 14 is a diagram showing an example 2000 of application of the memory system 1000 of FIG. 13.

Referring to FIG. 14, the memory system 2000 includes a semiconductor memory device 2100 and a controller 2200. The semiconductor memory device 2100 includes a plurality of memory chips. The semiconductor memory chips are divided into a plurality of groups.

In FIG. 14, it is illustrated that each of the plurality of groups communicates with the controller 2200 through first to k-th channels CH1 to CHk. Each semiconductor memory chip may have the same configuration and may operate in the same way as those of an embodiment of the semiconductor memory device 1300 described with reference to FIG. 2.

Each group communicates with the controller 2200 through one common channel. The controller 2200 has the same configuration as that of the controller 1200 described with reference to FIG. 13, and may control a plurality of memory chips of the semiconductor memory device 2100 through the plurality of channels CH1 to CHk.

In FIG. 14, a plurality of semiconductor memory chips is illustrated being coupled to a single channel. However, it should be understood that the memory system 2000 may operate in a way that a single semiconductor memory chip is coupled to a single channel.

Figure 15:
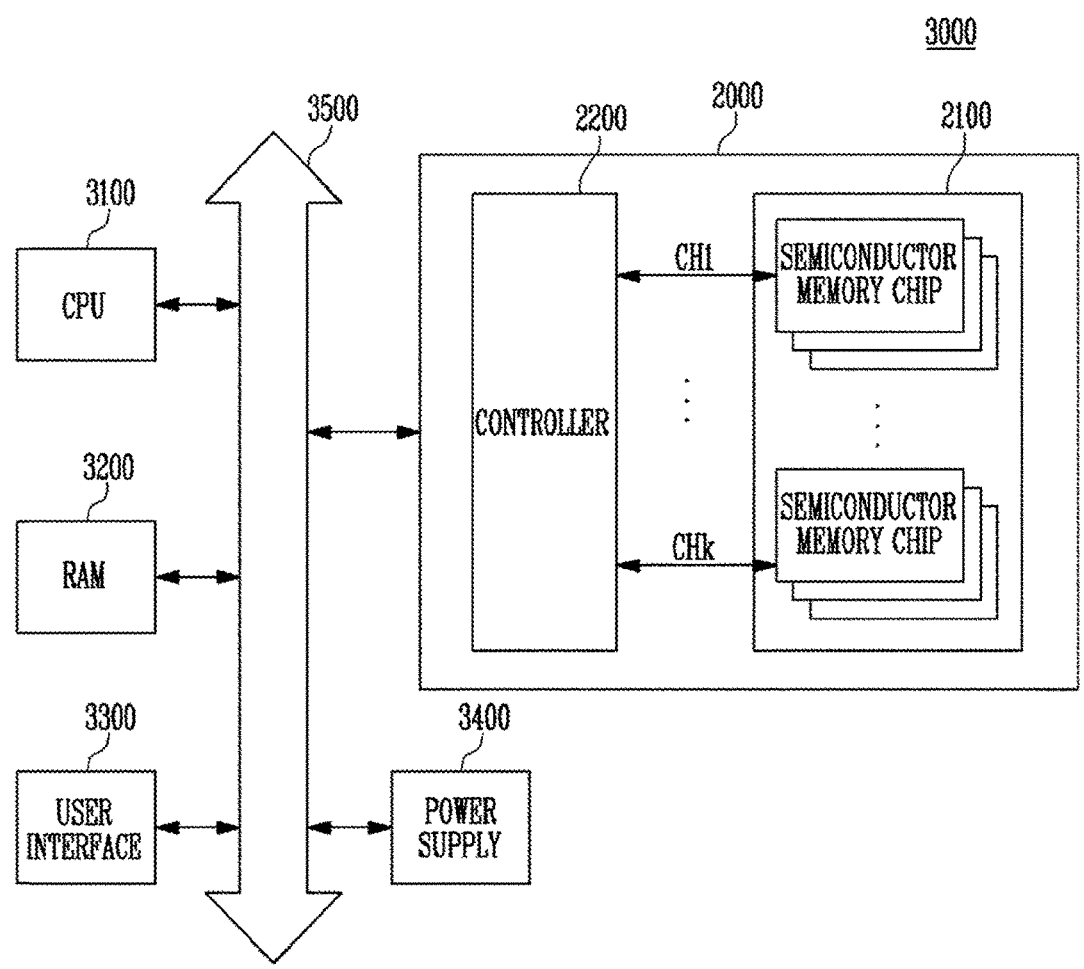
FIG. 15 is a diagram illustrating a computing system including the memory system described with reference to FIG. 14.

FIG. 15 is a diagram illustrating an example of a computing system including the memory system described with reference to FIG. 14.

Referring to FIG. 15, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 15, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 15, the memory system 2000 described with reference to FIG. 14 is illustrated as being used. However, the memory system 2000 may be replaced with the memory system 1000 described with reference to FIG. 13. In an embodiment, the computing system 3000 may include all of the memory systems 1000 and 2000 described with reference to FIGS. 13 and 14.

In accordance with the embodiments of the present disclosure, there are provided semiconductor memory device with improved reliability, and a method of operating the semiconductor memory device.

Although the example embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may be not always performed in regular order. Furthermore, the embodiments disclosed in the present specification and the drawings just aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
   a memory cell array including a plurality of memory cells to be programmed to any one of first to N-th program states distinguishable based on threshold voltages of the memory cells;
   a peripheral circuit configured to perform a program operation including a primary program operation and a secondary program operation on the plurality of memory cells; and a control circuit configured to control the peripheral circuit to perform a plurality of verify steps for the first to N−1-th program states and one verify step for the N-th program state during the primary program operation and to perform the secondary program operation on the plurality of memory cells to be programmed to the N-th program state after the primary operation is performed, wherein each of the plurality of verify steps comprises a pre-verify step and a main verify step corresponding to each of the first to N−1-th program states, and the one verify step is performed using a verification voltage that is equal to or higher than a verification voltage of the main verify step for the N−1-th program state.

2. The semiconductor memory device according to claim 1, wherein an additional verify step is performed for the N-th program state during the secondary program operation.

3. The semiconductor memory device according to claim 2, wherein the additional verify step is a verify step using a verification voltage that is higher than the verification voltage of the one verify step.

4. The semiconductor memory device according to claim 1, wherein the control circuit controls the peripheral circuit so that, whenever an application of a program pulse is repeated in the secondary program operation, a time during which the program pulse is applied is increased.

5. A semiconductor memory device, comprising:
a memory cell array including a plurality of memory cells to be programmed to any one of first to N-th program states distinguishable based on threshold voltages of the memory cells;
a peripheral circuit configured to perform a program operation on the plurality of memory cells; and
a control circuit configured to control the peripheral circuit so that the program operation is performed by performing at least two verify steps corresponding to each of the first to N-th program states until the memory cells to be programmed to the first to N−1-th program states have passed program verifications during the program operation,
wherein, if the memory cells to be programmed to the first to N−1-th program states have passed the program verifications, the control circuit performs a reprogram operation for the N-th program state,
wherein the at least two verify steps are verify steps that use a pre-verification voltage and a main verification voltage corresponding to each of the first to N-th program states, and
wherein the reprogram operation with respect to the memory cells to be programmed to the N-th program state is performed using the main verification voltage of the N-th program state.

6. The semiconductor memory device according to claim 5, wherein the control circuit controls the peripheral circuit such that, whenever an application of a program pulse is repeated in the reprogram operation, a time during which the program pulse is applied is increased.

7. A method of operating a semiconductor memory device including a plurality of memory cells to be programmed to any one of first to N-th program states distinguishable based on threshold voltages of the memory cells, the method comprising:
performing a primary program operation including a plurality of verify steps being performed for the first to N−1-th program states and one verify step being performed for the N-th program state; and after the primary program operation, performing a secondary program operation including an additional verify step on the plurality of memory cells to be programmed to N-th program state, wherein each of the plurality of verify steps comprises a pre-verify step and a main verify step corresponding to each of the first to N−1-th program states, and the one verify step is performed using a verification voltage that is equal to or higher than a verification voltage of the main verify step for the N−1-th program state.

8. The method according to claim 7, wherein performing the primary program operation comprises:
applying a program voltage to a selected word line coupled to memory cells selected from among the plurality of memory cells;
verifying whether the selected memory cells have been properly programmed by using verification voltages of the plurality of verify steps corresponding to each of the first to N−1-th program states and the verification voltage of the one verify step; and
repeating the applying of the program voltage and the verifying of the selected memory cells until the memory cells to be programmed to the N-th program state have passed program verifications.

9. The method according to claim 8, wherein, whenever the application of the program voltage is repeated, a time during which the program voltage is applied is increased.

10. The method according to claim 7, wherein performing the secondary program operation comprises:
applying a program voltage to a selected word line coupled to memory cells selected from among the plurality of memory cells;
verifying whether the selected memory cells have been properly programmed by using a verification voltage of the additional verify step; and
repeating the applying of the program voltage and the verifying of the selected memory cells until the memory cells to be programmed to the N-th program state have passed program verifications.

11. The method according to claim 7, wherein the additional verify step is a verify step using the verification voltage of the main verify step for the N-th program state.

12. The method according to claim 7, wherein the additional verify step is a verify step using a verification voltage that is higher than a verification voltage of the one verify step.

13. A method of operating a semiconductor memory device including a plurality of memory cells to be programmed to any one of first to N-th program states distinguishable based on threshold voltages of the memory cells, the method comprising:
performing a program operation by performing at least two verify steps corresponding to each of the first to N-th program states until the memory cells to be programmed to the first to N−1-th program states have passed program verifications; and
if the memory cells to be programmed to the first to N−1-th program states have passed the program verifications, performing a reprogram operation for the N-th program state,
wherein the at least two verify steps are verify steps that use a pre-verification voltage and a main verification voltage corresponding to each of the first to N-th program states, and wherein the reprogram operation with respect to the memory cells to be programmed to the N-th program state is performed using the main verification voltage of the N-th program state.

14. The method according to claim 13, wherein, whenever an application of a program pulse is repeated in the reprogram operation, a time during which the program pulse is applied is increased.

* * * * *